United States Patent [19]
Robles et al.

[11] Patent Number: 5,814,377
[45] Date of Patent: Sep. 29, 1998

[54] METHOD AND APPARATUS FOR CREATING STRONG INTERFACE BETWEEN IN-SITU SACVD AND PECVD SILICON OXIDE FILMS

[75] Inventors: Stuardo Robles, Sunnyvale; Visweswaren Sivaramakrishnan, Cupertino; Maria Galiano, San Jose; Victoria Kithcart, Fremont, all of Calif.

[73] Assignee: Applied Materials, Inc., Santa Clara, Calif.

[21] Appl. No.: 889,703

[22] Filed: Jul. 8, 1997

Related U.S. Application Data

[63] Continuation of Ser. No. 568,241, Dec. 6, 1995, abandoned.

[51] Int. Cl.$^6$ ............................ H05H 14/00; H01L 21/00; B05D 3/00
[52] U.S. Cl. ...................... 427/579; 427/255.3; 438/788; 438/789; 438/790; 438/784; 438/763
[58] Field of Search ..................... 427/563, 574, 427/579, 255, 255.3; 438/787, 788, 789, 790, 784, 763

[56] References Cited

U.S. PATENT DOCUMENTS

| | | | |
|---|---|---|---|
| 4,260,647 | 4/1981 | Wang et al. | 427/579 |
| 4,872,947 | 10/1989 | Wang et al. | 156/643 |
| 5,000,113 | 3/1991 | Wang et al. | 118/723 |
| 5,271,972 | 12/1993 | Kwok et al. | 427/579 |
| 5,286,518 | 2/1994 | Cain et al. | 427/579 |
| 5,319,247 | 6/1994 | Matsuura | 257/760 |
| 5,362,526 | 11/1994 | Wang et al. | 427/573 |
| 5,393,708 | 2/1995 | Hsia et al. | 437/228 |
| 5,426,076 | 6/1995 | Moghadam | 437/238 |
| 5,502,006 | 3/1996 | Kasagi | 437/195 |
| 5,593,741 | 1/1997 | Ikeda | 427/579 |
| 5,626,924 | 5/1997 | Ishikawa | 427/579 |
| 5,629,245 | 5/1997 | Inushima et al. | 427/579 |

OTHER PUBLICATIONS

McInerney et al., "A Planarized SiO$_2$ Interlayer Dielectric With Bias–CVD", I.E.E.E. Transactions on Electron Devices ED–34 (1987) Mar. No. 3, pp. 615–620.

Chanana et al., "Effect Of Annealing And Plasma Precleaning On the Electrical roperties of N$_2$0/SiH$_4$ PECVD Oxide As Gate Material In MOSFETs and CCDs", Solid–State Electronics 36 (1993) No. 7, pp. 1021–1026.

*Primary Examiner*—Marianne Padgett
*Attorney, Agent, or Firm*—Townsend & Townsend & Crew LLP

[57] ABSTRACT

A method and apparatus for ramping down the deposition pressure in a SACVD process. The present invention also provides a method and apparatus for subsequently ramping up the pressure for a PECVD process in such a manner as to prevent unwanted reactions which could form a weak interlayer interface. In particular, the deposition pressure in the SACVD process is ramped down by stopping the flow of the silicon containing gas (preferably TEOS) and/or the carrier gas (preferably helium), while diluting the flow of ozone with oxygen. A ramp down of the pressure starts at the same time. The diluting of the ozone with oxygen, limits reactions with undesired reactants at the end of a process.

23 Claims, 4 Drawing Sheets

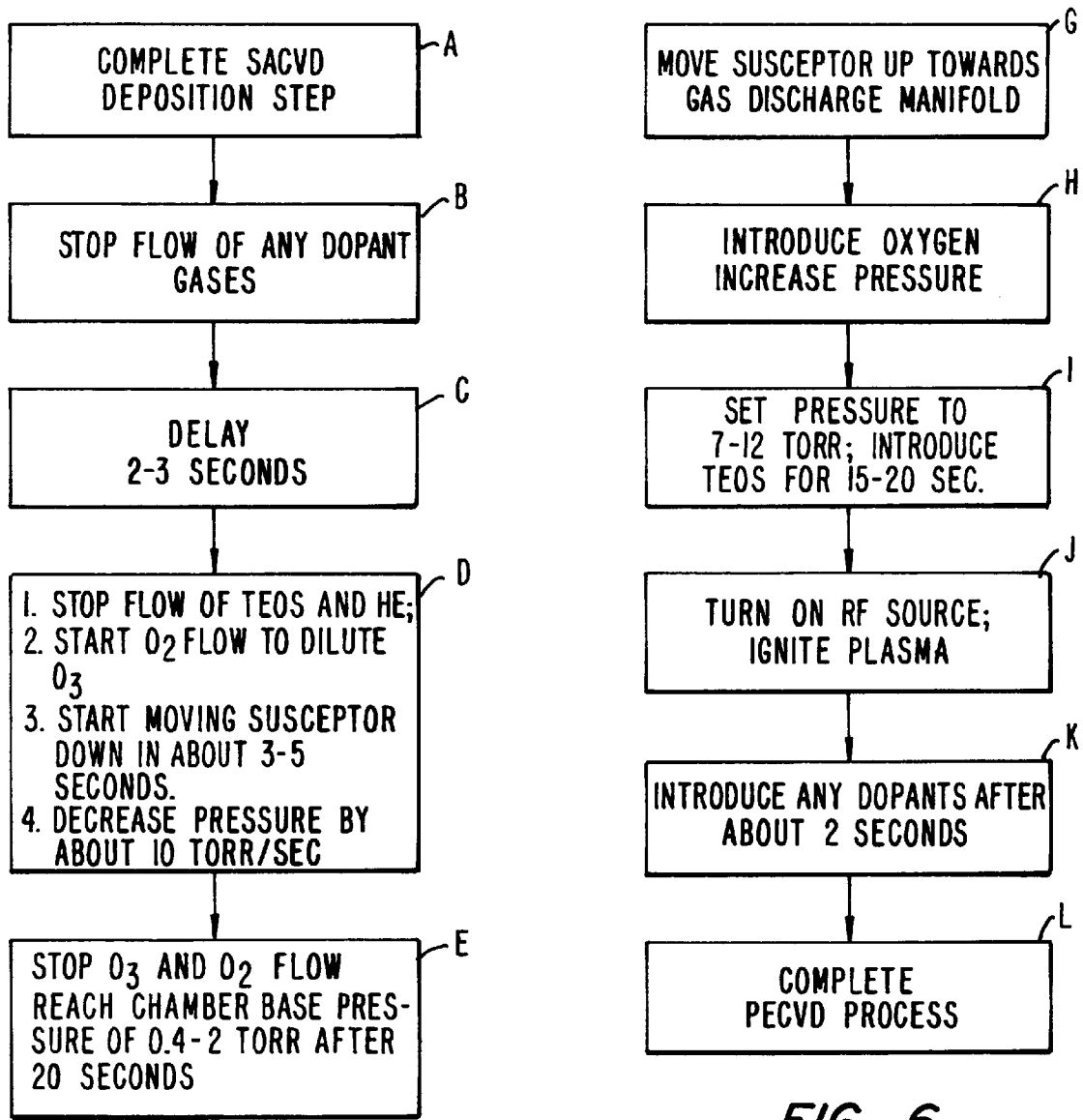

METHOD AND APPARATUS FOR CREATING STRONG INTERFACE BETWEEN IN-SITU SACVD AND PECVD SILICON OXIDE FILMS

This is a continuation of application Ser. No. 08/568,241, filed Dec. 6, 1995, now abandoned, the disclosure of which is incorporated by reference.

BACKGROUND OF THE INVENTION

The present invention relates to reducing defects on the surface of a chemical vapor deposition (CVD) silicon dioxide film, and in particular, such a film formed using ozone-TEOS chemistry, and immediately followed by a plasma enhanced chemical vapor deposition (PECVD) silicon dioxide film.

One of the primary steps in the fabrication of modern semiconductor devices is the formation of a thin film on the semiconductor substrate by chemical reaction of gases. Such a deposition process is referred to as chemical vapor deposition or "CVD" for short. Conventional thermal CVD processes supply reactive gases to the substrate surface where heat-induced chemical reactions take place to produce a desired film. The temperatures at which thermal CVD processes operate can damage device structures having metal layers. Plasma enhanced CVD (frequently referred to as PECVD) processes on the other hand, promote disassociation of the reactant gases by the application of radio frequency (RF) energy to a reaction zone proximate the substrate surface, thereby creating a plasma of highly-reactive ionic species. The high reactivity of the released ionic species reduces the energy required for a chemical reaction to take place, and thus lowers the required temperature for such CVD processes. The relatively low temperature of a PECVD process makes such processes useful, for example, for the formation of insulating layers over deposited metal layers.

A two layer insulating or dielectric film is often used and provides certain advantages over a single layer film. A low pressure, or sub-atmospheric CVD (SACVD) process can form a film which fills gaps well, such as gaps between metal lines or between polysilicon or other areas. One example of an SACVD process used by Applied Materials uses ozone and is typically in a temperature range of 350°–500° C. and a pressure of 20–620 torr. A SACVD process has a slow deposition rate, and thus it is desirable to use a "sandwich" layer with a second, PECVD layer deposited on top of the first layer. The PECVD layer can be created much more quickly, reducing the time required to deposit a layer of desired thickness. The second layer can then be planarized using a chemical mechanical polish (CMP).

Upon the termination of a SACVD process, it is possible for defects to form on the film surface due to reactions occurring after the termination of the process. These reactions can affect the integrity of the film, or the interface with any subsequent film.

In particular, where a PECVD process is used to deposit a second silicon dioxide film on top of the film formed by the SACVD process, inter-layer defects can be problematic. In particular, a subsequent etch to form a metal connection through the layer may etch laterally into the weak interface, thus causing metal to be deposited where it is not desired and preventing clean, vertical lines for the metal connection.

Each silicon dioxide layer may contain dopants which produce a particular type of dielectric layer. The layers can be undoped silica glass (USG), or can contain dopants such as phosphorous doped silicon glass (PSG) or boron and phosphorous doped silicon glass (BPSG). The dual layers can be used, for instance, for pre-metal dielectric (PMD) or for inter-metal dielectric (IMD) layers, or for an insulating or passivating layer.

The two layers can be different combinations of PSG, BPSG or USG. In particular, a SACVD USG layer could be followed by a PECVD USG layer. Alternately, a SACVD PSG layer could be followed by a PECVD layer of USG or PSG. A SACVD BPSG layer could be followed by a PECVD layer of BPSG, PSG, or USG. A preferred silicon source is TEOS, while TMB or TEB may be used for the boron source and TEPO, TEP, TMP OR TMOP may be used for the phosphorous source.

One method of creating the two layers is to deposit the first layer, and then move the wafer to a second reactor chamber for depositing the plasma enhanced film. The disadvantage of this method is the need for a second reactor chamber, and the need to move the wafer to the other chamber, requiring additional time.

A second method uses a chamber which has the capability for both SACVD (20–620 torr) and PECVD (0.5–20 torr) processes. The chamber is first used for an SACVD process to deposit the first layer, and then the wafer is removed from the chamber and the chamber is cleaned. The wafer is subsequently brought back into the chamber to deposit the plasma enhanced film. This eliminates the forming of defects due to reactions with materials from the first process in the second process by having the chamber cleaned between processes. This process requires only a single chamber, but also requires the time for removing and replacing the wafer with the intermediate steps of cleaning the chamber.

Simply doing the two depositions back to back in the same chamber without an intermediate clean has been found to produce a weak interface between the two silicon dioxide layers.

FIG. 3 illustrates a cross-sectional view of a dual layer film having a lower layer 54 and an upper layer 56. A channel 58 is shown being etched through the two layers and filled with metallization. As can be seen, due to a poor interface 60, the etching can eat into the sidewalls at positions 62. As can be seen, the sidewalls are thus not clean, which can affect the performance and integrity of a circuit formed on the wafer.

Defects can occur to cause a weak interface when, at the end of the SACVD step, during pump down, ozone reacts with different reactants in the chamber after the dopant gases and TEOS are turned off. On the start of the PECVD process, the dopants may react with oxygen to form $B_2O_3$ or $P_2O_5$, in the interface, which could result in a weak interface. Boron and phosphorus oxides mixed in with the silicon oxide are desirable, but not if the boron and phosphorus oxides predominate over the silicon oxide.

Interface problems between other dielectric layers have been addressed in different ways in the prior art. For instance, U.S. Pat. No. 5,271,972 discusses forming a PECVD layer first, and then depositing a thermal CVD layer. In order to reduce the surface sensitivity at the interface, the patent discusses doing a stepwise reduction of power at the end of the PECVD process.

In U.S. Pat. No. 5,426,076, another method is discussed for forming a better interface with a PECVD layer being deposited first with a subsequent thermal CVD layer (THCVD). In this patent, an oxygen plasma ($O_2$) clean step is performed to remove deposits of liquid TEOS formed in the PECVD process. This prevents TEOS from reacting with the ozone in the subsequent THCVD process.

The present invention is addressed to both a SACVD layer process and a dual dielectric layer in which the PECVD process comes second, not first. There is a need for improving the interface between the two layers while allowing the two processes to occur in-situ, or back-to-back, in the same chamber without an intermediate chamber cleaning step.

SUMMARY OF THE INVENTION

The present invention provides a method and apparatus for ramping down the deposition pressure in a SACVD process. The present invention also provides a method and apparatus for subsequently ramping up the pressure for a PECVD process in such a manner as to prevent unwanted reactions which could form a weak interlayer interface. In particular, the deposition pressure in the SACVD process is ramped down by stopping the flow of the silicon containing gas (preferably TEOS) and/or the carrier gas (preferably helium), while diluting the flow of the oxygen reacting gas, such as diluting the flow of ozone with oxygen. A ramp down of the pressure starts at the same time. The diluting of the ozone with oxygen limits reactions with undesired reactants at the end of a process.

If a dopant gas is used in the $O_3$-TEOS process, preferably the dopant gas is turned off for about two seconds before turning off the TEOS and helium carrier flow, to allow the dopant gases to be consumed. Preferably, when the oxygen is introduced to dilute the ozone, the wafer is moved away from the gas discharge head. The pressure is preferably reduced at a rate of approximately 10 torr per second until the reaction chamber base pressure (0.4–2 torr) is reached.

The present invention also prevents defects from forming during the ramping up of the PECVD process. This is done by first introducing oxygen and increasing the pressure. The susceptor with the wafer is concurrently or previously moved up to near the gas discharge head. Subsequently, the silicon containing gas (TEOS) is introduced and the plasma is ignited. Preferably, the plasma is started with oxygen and TEOS for about 1–2 seconds before introducing any dopants to be used in generating the silicon dioxide layer.

For a fuller understanding of the objects and advantages of the present invention, reference should be made to the ensuing detailed description taken in conjunction with the accompanying drawings.

BRIEF DESCRIPTION OF THE DRAWINGS

FIG. 5 is a flowchart illustrating the SACVD ramp-own steps of the present invention; and FIG. 6 is a flowchart illustrating the PECVD ramp-up steps of the present invention.

DETAILED DESCRIPTION OF THE PREFERRED EMBODIMENTS

Figure 1:
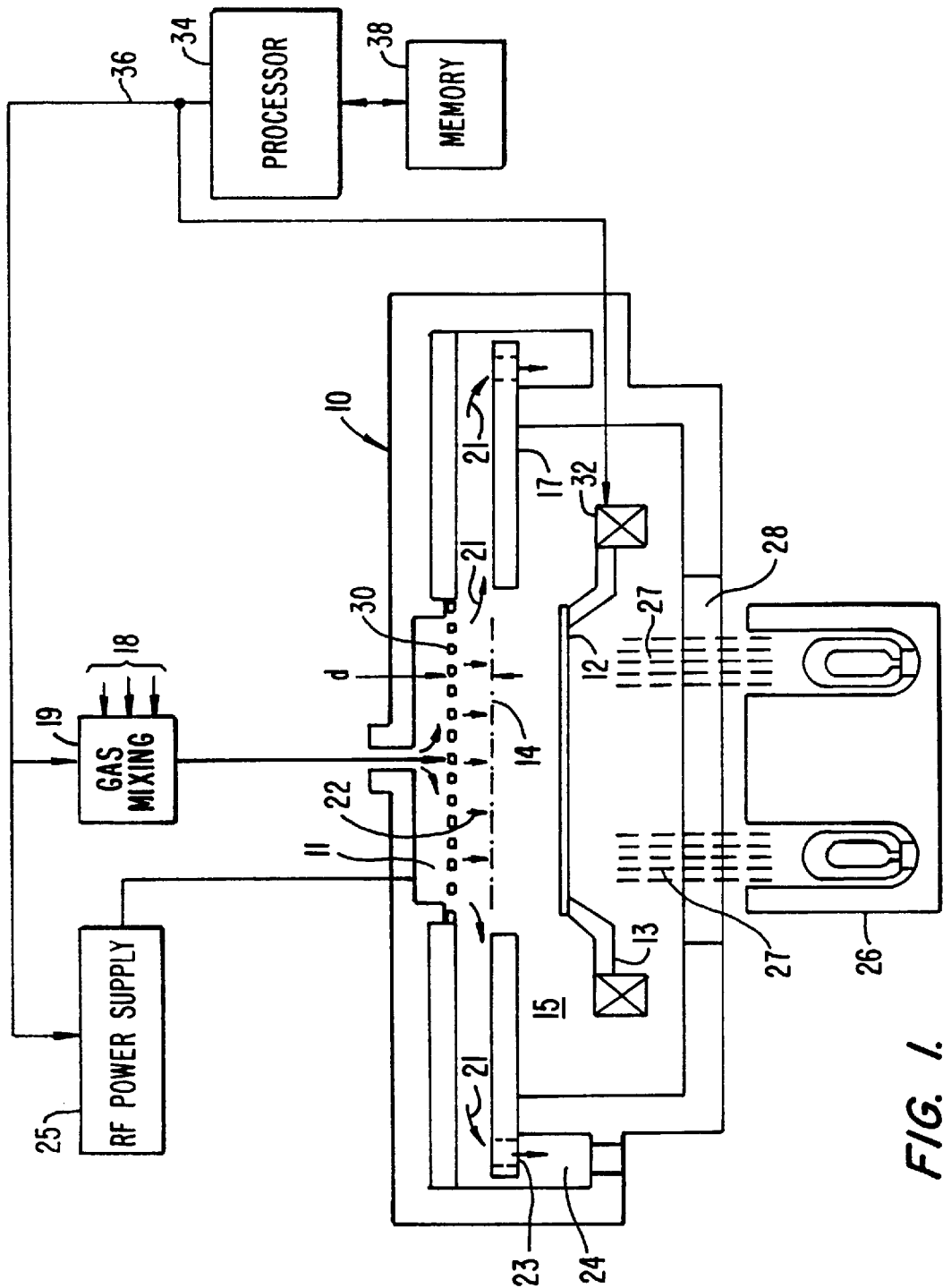
FIG. 1 is a vertical, cross-sectional view of a simplified CVD reactor according to the present invention.

One suitable CVD system in which the method of the present invention can be carried out is shown in FIG. 1 which is a vertical, cross-sectional view of a simplified, parallel plate chemical vapor deposition system 10 having a vacuum chamber 15. System 10 contains a gas inlet manifold 11 for dispersing deposition gases to a wafer, not shown, that rests on a susceptor 12. Susceptor 12 is highly thermally responsive and is mounted on a support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. During processing, gas inlet to manifold 11 is uniformly distributed radially across the surface of the wafer as indicated by arrows 21. The gas is then exhausted via ports 23 into the circular vacuum manifold 24 by a vacuum pump system (not shown). Before reaching manifold 11, deposition and carrier gases are input through gas lines 18 into a mixing system 19 where they are combined and then sent to manifold 11. This CVD system has the capability of performing, without hardware modification, both a SACVD process (20–620 torr) and a PECVD process (0.5–20 torr).

The deposition process performed in system 10 can be either a thermal process or a plasma enhanced process. The thermal process would typically be a SACVD process that uses ozone and TEOS in a temperature range of 350°–500° C. and a pressure range of 20–620 torr. In a plasma process, a controlled plasma is formed adjacent to the wafer by RF energy applied to inlet manifold 11 from RF power supply 25 (with susceptor 12 grounded). In one embodiment, the RF power is connected by a strap to a support for inlet manifold 11, although other connection points could be used. Inlet manifold 11 is also an RF electrode, while susceptor 12 is grounded. RF power supply 25 can supply either single or mixed frequency RF power to manifold 11 to enhance the decomposition of reactive species introduced into chamber 15.

An external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

Typically, any or all of the chamber lining, gas inlet manifold faceplate, support fingers 13, and various other system hardware is made out of material such as anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Chang et al. and assigned to Applied Materials, Inc., the assignee of the present invention, which is incorporated herein by reference for all purposes.

A motor 32 raises and lowers susceptor 12 between a processing position 14 and a lower, wafer-loading position. Motor 32, gas mixing system 19 and RF power supply 25 are controlled by a processor 34 over control lines 36. Processor 34 operates under the control of a computer program stored in a memory 38. The computer program dictates the timing, mixture of gases, RF power levels, susceptor position, and other parameters of a particular process.

Figure 2:
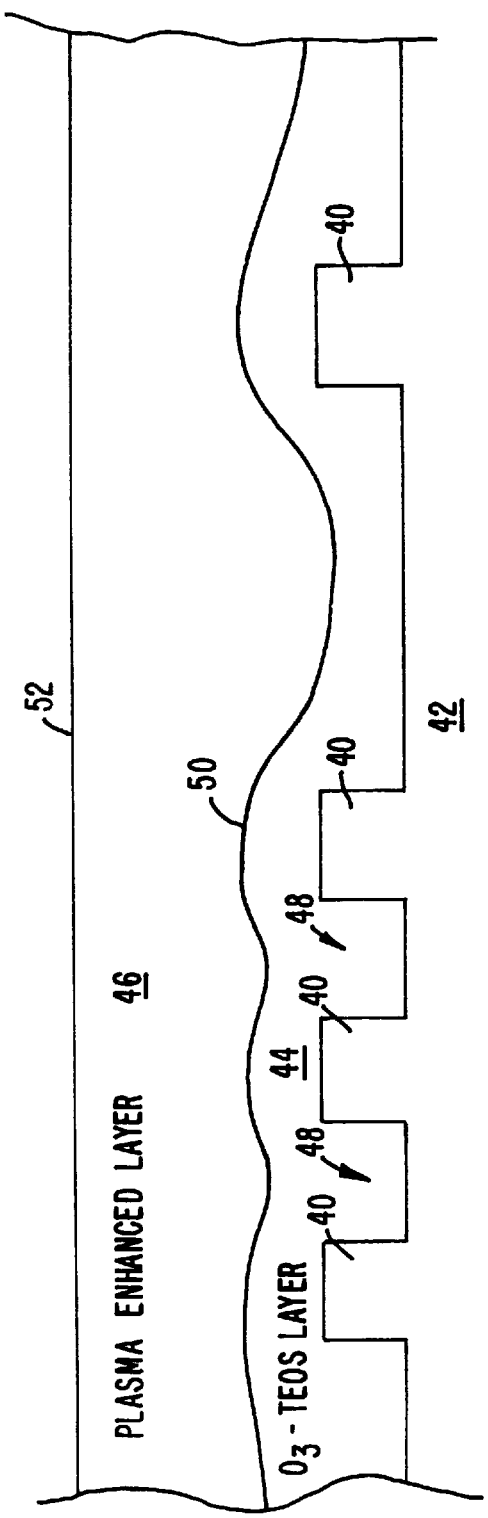
FIG. 2 is a cross-sectional diagram of a two layer dielectric according to the present invention.

FIG. 2 is a cross-sectional view of a portion of one example of a wafer formed according to the present invention. The cross-sectional view shows a number of metal or polysilicon lines 40 formed over a lower layer 42. Lower layer 42 would typically include transistors or other components which the metal or polysilicon lines 40 interconnect. In order to deposit a second layer of metal, or simply passivate the metal layer, an intermediate insulation layer is needed. This is formed in the present invention using two layers. The first layer is a SACVD layer 44. A SACVD process, is used because it is good for filling in gaps such as gap 48 between the metal lines 40. The SACVD process could also be used to fill gaps between polysilicon or other structures as a pre-metal layer of other layer. In addition, the doped SACVD layer can be annealed to temperatures ranging from 750° C. to 950° C. to provide a planarized or partially planarized layer. Since the SACVD layer does not deposit very fast, a second plasma enhanced layer 46 is deposited, which can quickly form a thick layer. Top surface 52 can be planarized using CMP. As pointed out in the background above, to form a good interface 50, typically two chambers are used, or the wafer is removed from the chamber and a clean is done after the SACVD layer 44 is deposited, and before the plasma enhanced layer 46 is deposited. The present invention provides a process for forming a good interface 50 without removing the wafer from the chamber and without doing an intermediate cleaning step. This is accomplished by a novel procedure for the ramp-down of the pressure of a SACVD deposition step illustrated in FIG. 5 and a ramp-up procedure for the PECVD process as illustrated in FIG. 6. The SACVD procedure is also useful for avoiding surface defects for a single layer embodiment.

Figure 4:
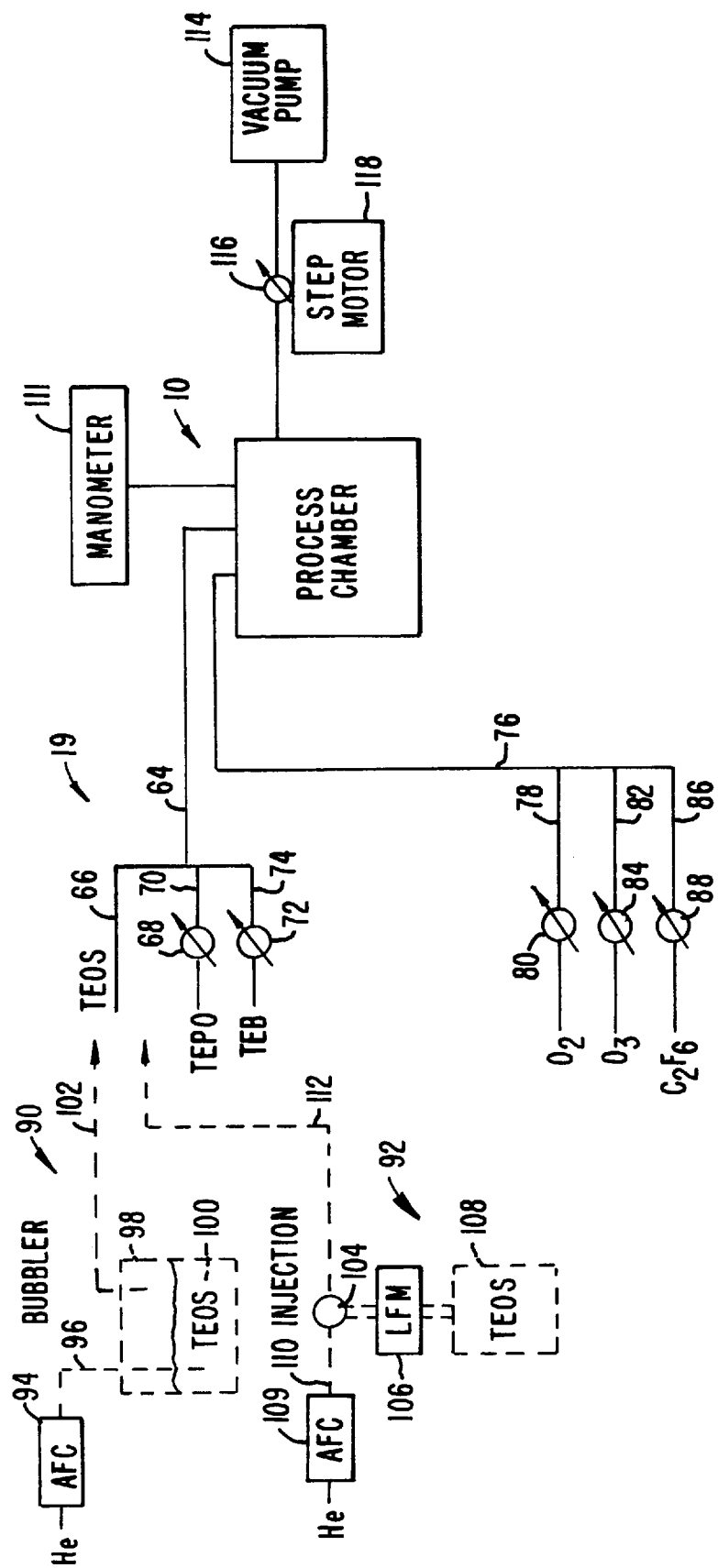
FIG. 4 is a diagram of a process system illustrating the different gas sources and mixes.

FIG. 4 illustrates the gas mixing system 19 which supplies gas to process chamber 10. A first line 64 is used to mix TEOS from a line 66 along with any dopants that may be provided, such as TEPO through a valve 68 on a line 70, and TEB through a valve 72 on a line 74. Separately, a second line 76 delivers oxygen to the gas discharge manifold in process chamber 10 through a line 78 controlled by a valve 80, and/or ozone through a line 82 controlled by a valve 84, and possibly a fluorine containing gas, such as $C_2F_6$ through a line 86 controlled by a valve 88.

The process gases generated from the liquid sources (TEOS, TEB, TEPO, etc.) may be provided by a variety of methods. Two alternate methods are shown for one example, TEOS on line 66. Similar arrangements can be used to generate a gas from TEPO (or TEP, TMP or TMOP) to valve 68 or a gas from TEB (or TMB) to valve 72. In the TEOS examples, the TEOS generated gas can either be provided through a bubbler system 90 or an injection system 92. These are indicated with dotted lines, since one or the other would be used. In bubbler system 90, helium controlled by an automatic flow controller (AFC) 94 is provided through a line 96 into a vessel 98 containing liquid TEOS 100 at a temperature between 30°–50° C. The bubbling of the helium into the vessel will carry TEOS vapor to the CVD chamber along line 102 which will connect to line 66.

Alternately, liquid TEOS from TEOS source 108 is provided through a liquid flow meter (LFM) 106 to an injection valve 104. TEOS source 108 may include a degasser to remove helium where pressurized helium is used to pump the TEOS. A degasser may also be used in the bubbler embodiment. The liquid flow meter controls the flow rate of the liquid TEOS. Helium as a carrier gas is provided to injection valve 104 through an automatic flow controller 109 and a conduit 110. In injection valve 104, the liquid TEOS is vaporized due to a sudden pressure or volume change. The vaporized TEOS is carried to the process chamber by the Helium carrier gas along conduits 112 and 66.

On the other side of the chamber, a vacuum pump 114 is connected to an exhaust line from the chamber through a variable or throttle valve 116 controlled by a stepper motor 118. When the stepper motor closes valve 116, the gas that is provided into process chamber 10 will increase the pressure in the chamber. When the valve 116 is open, the pressure in the chamber can be decreased. During a process, the proper pressure can be maintained by using a feedback loop and controlling valve 116 under servo control to maintain the desired pressure.

A dual manometer 11 is used to measure the pressure in process chamber 10. The manometer can measure pressures in the range of 0–100 torr (for the PECVD process) or in the range of 0–1000 torr (for the SACVD process). The measured pressure is provide to processor 34 of FIG. 1 for feedback control.

FIG. 5 is a flowchart of one embodiment of a CVD ramp-down according to the present invention. As shown in step A, the SACVD deposition step is first completed. In one embodiment, this process involves a gas mixture of ozone ($O_3$) and TEOS being provided to the chamber with the chamber at a pressure of approximately 200 torr. The susceptor is heated to a temperature of 400°–500° C. by the heating lamps, and no power is applied between the RF power supply and the susceptor since this is not a plasma enhanced process. If the process is one for a doped silicon glass, as opposed to undoped (USG), the gas mixture will also include gases containing phosphorous or phosphorous and boron, such as TEB (triethylborate) and TEPO (triethylphosphate). The susceptor is spaced from the gas discharge manifold by 200–300 mils. An ozone flow rate of 2000–5000 sccm is used. For an injection system process, one embodiment also includes 200–600 mgm of TEOS, 40–90 mgm of TEPO and 100–250 mgm of TEB. In the injection system, the flow of the helium carrier is 2000–8000 sccm. In one embodiment of a bubbler system, on the other hand, the flow of the Helium carrier into the liquid TEOS vessel is 2000–5000 sccm, the flow of the He carrier into the TEPO vessel is 2000–6000 sccm and the He carrier flow into the TEB vessel is 200–400 sccm.

Once the process has been running for a sufficient amount of time to deposit a layer 44 (as shown in FIG. 2) of sufficient thickness, the flow of the dopant gases containing boron, or phosphorous and boron, is first stopped (step B in FIG. 5). After a delay of 1–5 seconds, preferably 2–3 seconds (step C), the flow of the silicon containing gas (TEOS) and/or the carrier gas (helium) is stopped (step D). This prevents the ozone from reacting with the dopant gases without sufficient TEOS being present. This amount of time has been empirically determined to be 1–5 seconds, preferably 2–3 seconds.

Also in step D, the ozone flow is diluted with oxygen. Preferably, an $O_2$ flow of 3000 sccm is added for an ozone flow rate of 4000 sccm, and proportionate amounts for other flow rates. This prevents defects from forming because otherwise, if high concentration ozone is present at during pressure ramp-down, the dopants and TEOS could react in an undesired and uncontrolled way.

After the oxygen flow is started, the susceptor and wafer are moved away from the gas discharge manifold (step D). This movement is started immediately after the oxygen flow starts, and the oxygen flow is started at the same time that the TEOS and the helium are stopped. Moving the susceptor downward not only reduces the likelihood of reaction, but also moves it away from the vacuum exhaust, thus making it less likely that defects will be pulled across it.

Next, as the susceptor starts moving from its processing spacing of approximately 230 mils from the gas discharge faceplate, to a position of 600 mils from the gas discharge faceplate, the pressure is also decreased. The decrease in pressure is preferably done at a rate of approximately 10 torr per second until the pressure is dropped to the reaction chamber base pressure of approximately 0.4–2 torr. This process takes approximately 10–20 seconds depending upon the processing pressure.

After the flow of oxygen and ozone is stopped, the pressure reaches the chamber base pressure of 0.4–2 millitorr (step E).

The ramp down process of the present invention, by turning off the dopant flow before turning off the ozone/TEOS flow, will cause a surface layer to not have dopant reactants predominate. In fact, silicon dioxide alone may form the surface layer, which is preferable to having an excess of dopants on the surface layer. In an alternate embodiment, instead of using oxygen to dilute the ozone, nitrogen could be used instead.

If the SACVD process is to be followed by a PECVD process, the PECVD process can be started approximately 2–3 seconds after the completion of the SACVD process by turning off the oxygen and ozone flow. During that time, the temperature is maintained so that the PECVD process will be quickly started. FIG. 6 illustrates the steps for the ramp-up of a PECVD process to minimize interface defects between two layers. The susceptor is first moved from 600 mils to 230–260 mils from the gas discharge head (step G). Next, the pressure is increased again for the PECVD ramp-up (step H) with a flow of oxygen, preferably around 1000 sccm. This occurs at a rate of approximately 1 torr per second to increase it from the chamber base pressure of 0.4–2 torr to an operating pressure of between 5 and 15 torr, and typically takes 10–15 seconds.

Next, the TEOS for the formation of the next film is introduced into the chamber (step I) preferably at approximately 600–700 sccm, and the pressure is raised to the final process pressure, preferably 7–12 torr. After the TEOS has been introduced for about 14–20 second, the plasma is ignited by being turned on at a power of approximately 550–600 watts (step J). After about 2 seconds, with the plasma thus ignited, any dopants are introduced into the chamber (step K) and the deposition process proceeds (step L). For one embodiment, a flow rate of TEOP at 580 sccm may be used for PSG, and TEB at 50 sccm with TEPO at 1100 sccm for BPSG. Alternately, other flow rates may be used, or a bubbler process may be used. By doing the ramp-up in pressure and spacing, and by introducing TEOS and $O_2$ before the dopants, the formation of compounds of boron with oxygen and phosphorous with oxygen, such as $B_2O_2$ and $P_2O_5$ is avoided at the interface of the two layers. These compounds, if formed, would weaken the interface between the two layers.

Figure 3:
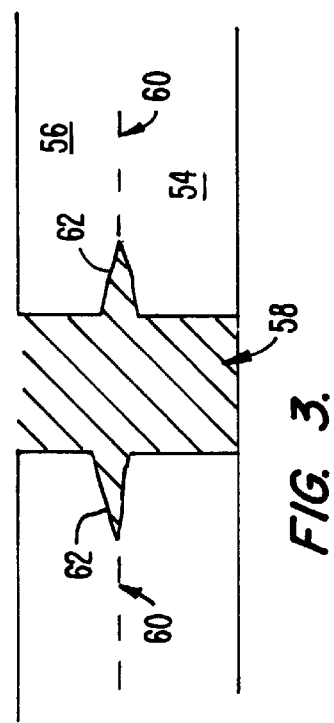
FIG. 3 is a cross-sectional view of an etched channel through a dual layer film illustrating the effects of a defective interface.

The strength of the interface between two layers in the wafer formed according to the present invention was tested by the inventors. After the films were deposited, the wafer was annealed at 600° F. Next, the wafer was put in acid, KOH, which etches the polysilicon but not the silicon dioxide. After about 20 seconds of the hot acid etch, the strength of the interface was observed under a scanning electron microscope. The etch pattern revealed the lack of any defects such as that shown in FIG. 3.

As will be understood by those with skill in the art, the present invention may be embodied in other specific forms without departing from the spirit or essential characteristics thereof. For example, the susceptor could be moved toward the manifold later in the PECVD ramp-up. Accordingly, the description of the preceding embodiments is intended to be illustrative of the invention, and reference should be made to the following claims for setting forth the scope of invention.

What is claimed is:

1. A method for depositing a layer of silicon oxide on a substrate using a subatmospheric chemical vapor deposition (SACVD) process followed by a plasma-enhanced chemical vapor deposition (PECVD) process without an intermediary clean or etch process, said method comprising steps, in order, of:

(a) flowing a first silicon containing gas and ozone into a chamber at a pressure and a temperature sufficient to deposit a first portion of the layer of silicon oxide on the substrate;
   (b) stopping the flow of the first silicon containing gas; and simultaneously
   (c) diluting the flow of the ozone;
   (d) controllably decreasing the pressure;
   (e) flowing oxygen into the chamber;
   (f) controllably increasing the pressure;
   (g) flowing a second silicon containing gas into the chamber, wherein said second silicon containing gas is identical to, or different from, the first silicon containing gas of step (a);
   (h) igniting a plasma; and
   (i) depositing a second portion of the layer on the first portion of the layer of silicon oxide.

2. The method of claim 1 wherein the step (a) further includes flowing a dopant-containing gas into the chamber during the step (a), wherein the layer becomes doped; and wherein the method of claim 1 further comprises a step of stopping the flow of the dopant-containing gas prior to the step (b) of stopping the flow of the first silicon containing gas.

3. The method of claim 1 wherein said second silicon containing gas of the step (g) comprises tetraethylorthosilicate (TEOS).

4. The method of claim 1 wherein the plasma is ignited between 15 and 20 seconds after the flow of the second silicon containing gas of the step (g) is started.

5. The method of claim 1 wherein the pressure of the step (f) is increased at a rate of between about 0.5 and 5 torr per second.

6. The method of claim 1 wherein the first silicon containing gas and the ozone of step (a) are flowed into the chamber from a gas discharge head; and the step (c) of diluting the flow of the ozone further includes moving the substrate away from the gas discharge head.

7. The method of claim 1 further comprising a step of flowing a dopant into the chamber after the step (h) of igniting the plasma.

8. The method of claim 2 wherein the step (b) of stopping the flow of the first silicon containing gas is commenced between about 1–5 seconds after stopping the flow of the dopant containing gas.

9. The method of claim 1 wherein said first silicon containing gas of step (a) comprises tetraethylorthosilicate (TEOS).

10. The method of claim 1 wherein the step (d) of controllably decreasing the pressure is done at a rate of between about 5 and 50 torr per second.

11. The method of claim 1 wherein said pressure is decreased in the step (d) to a base pressure in a range of about 0.4–2 torr.

12. The method of claim 1 wherein said step (c) of diluting the flow of the ozone comprises diluting with one or more less reactive gases, wherein said less reactive gas comprises oxygen or nitrogen.

13. The method of claim 1 wherein said pressure of the step (a) is greater than 20 torr.

14. A method for transitioning from a subatmospheric chemical vapor deposition (SACVD) process to a plasma enhanced chemical vapor deposition (PECVD) process comprising, in order, steps of:
   (a) flowing tetraethylorthosilicate (TEOS) and ozone into a chamber at a pressure and a temperature sufficient to deposit a first portion of a layer of silicon oxide on a substrate;
   (b) stopping the flow of the TEOS; and simultaneously
   (c) diluting the flow of the ozone;
   (d) controllably decreasing the pressure;
   (e) flowing oxygen into the chamber;
   (f) controllably increasing the pressure;
   (g) flowing a silicon containing gas into the chamber;
   (h) igniting a plasma; and
   (i) depositing a second portion of the layer.

15. The method of claim 14 further comprising flowing a dopant containing gas into the chamber after the step (h) of igniting the plasma.

16. The method of claim 14 wherein said silicon containing gas of the step (g) comprises tetraethylorthosilicate (TEOS).

17. The method of claim 14 wherein the step (h) of igniting the plasma begins between about 15 and 20 seconds after the step (g) of flowing the silicon containing gas.

18. The method of claim 14 wherein the step (f) of increasing the pressure is done at a rate of between about 0.5–5 torr per second.

19. The method of claim 14 wherein said pressure of the step (a) is greater than 20 torr.

20. The method of claim 14 wherein the step (c) of diluting the flow of the ozone comprises diluting with one or more less reactive gases, said less reactive gas comprising nitrogen or oxygen.

21. A method for transitioning from a subatmospheric chemical vapor deposition (SACVD) process to a plasma enhanced chemical vapor deposition (PECVD) process comprising, in order, steps of:
   (a) flowing tetraethylorthosilicate (TEOS) gas and ozone from a gas discharge head into a chamber at a pressure and a temperature sufficient to form a silicon oxide layer on a substrate;
   (b) stopping the flow of the TEOS gas, and simultaneously diluting the flow of the ozone with a first oxygen flow,
   (c) moving the substrate away from the gas discharge head,
   (d) as the substrate starts moving, decreasing the pressure at a rate of between about 5 and 50 torr per second and stopping said flow of said ozone and said first oxygen flow, after which a base pressure of 0.4–2 torr is obtained;
   (e) flowing a second oxygen flow into the chamber;
   (f) increasing the pressure from said base pressure at a second rate of between 0.5 and 5 torr per second to a third pressure,
   (g) flowing TEOS into the chamber, and
   (h) igniting a plasma between about 15 and 20 seconds after said third pressure has been achieved.

22. The method of claim 21 wherein said pressure of the step (a) is greater than 20 torr.

23. A method for depositing a layer of silicon oxide on a substrate using a subatmospheric chemical vapor deposition (SACVD) process followed by a plasma-enhanced chemical vapor deposition (PECVD) process without an intermediary clean or etch process, said method comprising steps, in order, of:
   (a) flowing a first silicon containing gas and ozone into a chamber at a pressure and a temperature sufficient to deposit a first portion of the layer of silicon oxide on the substrate;
   (b) stopping the flow of the first silicon containing gas; and simultaneously
   (c) diluting the flow of the ozone; to limit occurrences of reactions after step (b) and thereby avoid formation of interlayer surface defects on the first portion of the layer;
   (d) controllably decreasing the pressure;
   (e) flowing oxygen into the chamber;
   (f) controllably increasing the pressure;
   (g) flowing a second silicon containing gas into the chamber, wherein said second silicon containing gas is identical to, or different from, the first silicon containing gas of step (a);
   (h) igniting a plasma; and
   (i) depositing a second portion of the layer on the first portion of the layer of silicon oxide.

* * * * *